United States Patent [19]

Oliva, Jr.

[11] 3,902,125

[45] Aug. 26, 1975

[54] SYMMETRIC OUTPUT, DIGITAL BY THREE COUNTER

[75] Inventor: George R. Oliva, Jr., Eatontown, N.J.

[73] Assignee: The United States of America as represented by the Secretary of the Army, Washington, D.C.

[22] Filed: June 18, 1974

[21] Appl. No.: 480,320

[52] U.S. Cl. ............... 328/39; 235/150.3; 235/196; 307/220 R; 307/225 R

[51] Int. Cl.² ........................................ H03K 21/00

[58] Field of Search .................. 328/39, 41, 49, 51; 307/220 R, 225 R; 235/150.3, 196

[56] References Cited

UNITED STATES PATENTS 3,439,278 4/1969 Farrow ................................ 328/41

3,571,727 3/1971 Lombardi ........................... 328/41

*Primary Examiner*—Siegfried H. Grimm

*Attorney, Agent, or Firm*—Nathan Edelberg; Robert P. Gibson; Jeremiah G. Murray

[57] ABSTRACT

A digital divide by three (÷ 3) counter providing a symmetrical square wave output waveform from a square wave input signal utilizing digital logic devices. The circuitry includes a conventional divide by three digital counter whose non-symmetrical square wave output is fed to one input of an AND gate and to one input of a delay type flip-flop circuit after being fed through a logic inverter. The square wave input fed to the counter is additionally fed to the other input of the AND gate and the delay type flip-flop, whereupon the output of the AND gate and flip-flop are fed to an OR gate whose output comprises the desired symmetrical waveform.

10 Claims, 2 Drawing Figures

SYMMETRIC OUTPUT, DIGITAL BY THREE COUNTER

The invention described herein may be manufactured and used by or for the Government for governmental purposes without payment of any royalties thereon or therefor.

BACKGROUND OF THE INVENTION

1. Field of the Invention

The present invention relates generally to digital type electronic circuitry and more particularly to digital counter circuits whereupon the frequency of the input signal is digitally divided by an odd numbered integer, for example, three.

2. Description of the Prior Art

Digital counters comprised of a plurality of interconnected bistable or divide by two counter stages are well known to those skilled in the art. When digitally dividing by an odd number, such as three, however, the resultant waveform is non-symmetrical even though it is one third the original frequency of the square wave input signal which is symmetrical. For certain types of applications triggering is required to be generated from both the rising and falling edge of a waveform wherein the time between the rising edge and falling edge is constant and thus a symmetrical signal is required. The conventional approach for making a non-symmetrical waveform symmetrical is to employ one shot devices such as monostable multivibrators; however, such devices require external resistors and capacitors for timing and are thus frequency dependent resulting in a great deal of difficulty in obtaining repeatable results at different frequencies.

SUMMARY

The present invention is directed to an improved divide by three (÷ 3) counter comprised of digital logic devices interconnected to provide a symmetrical output which is frequency independent and is additionally highly reproducible.

Briefly, the subject invention is comprised of a conventional divide by three digital counter providing a non-symmetrical output. The non-symmetrical divide by three output waveform is coupled to an AND gate which receives as its other input the symmetrical square wave input signal which acts as the clock signal. The non-symmetrical divide by three output is additionally inverted and fed to the data input of a delay type flip-flop circuit whose clock input is also connected to the symmetrical input signal. The output of the AND gate and the output of the delay type flip-flop circuit appearing at its Q output terminal is fed to an OR gate whose output comprises a symmetrical divide by three waveform. The circuitry thus acts to take the non-symmetrical divide by three waveform which is delayed one count of the clock signal by the D type flip-flop and add thereto the high state portion of the succeeding cycle of the square wave input waveform to provide a composite symmetrical output waveform which comprises the desired signal.

DESCRIPTION OF THE PREFERRED EMBODIMENTS

Figures 1, 2:
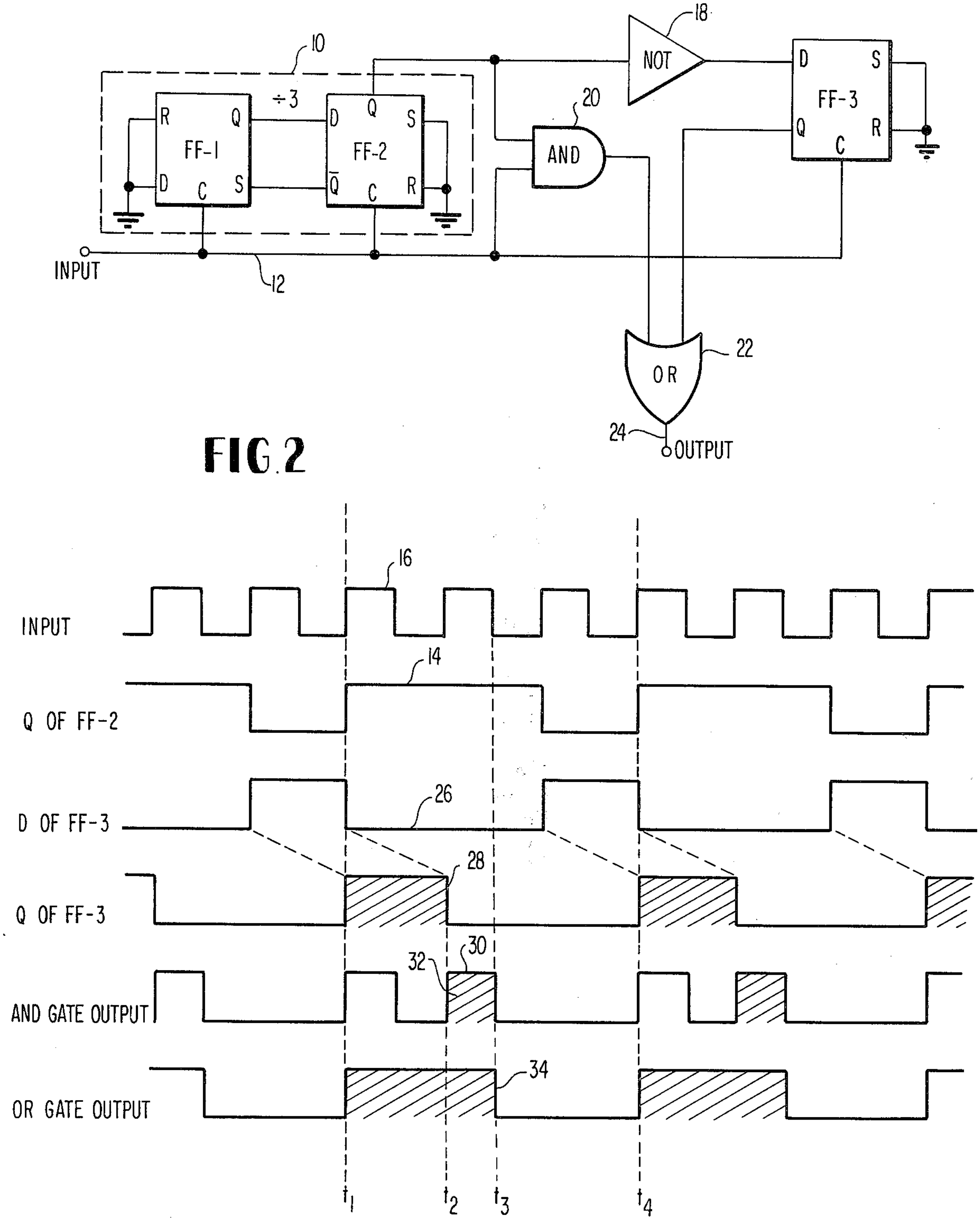
FIG. 1 is an electrical schematic diagram of the preferred embodiment of the subject invention.
FIG. 2 is set of time related waveforms illustrative of the operation of the circuitry shown in FIG. 1.

Referring now to the drawings and more particularly to FIG. 1, reference numeral 10 designates a binary digital divide by three (÷ 3) circuit which provides an unsymmetrical output waveform characteristic of prior art divide by three counters. The counter 10 may be comprised of any desired configuration; however, for the sake of explanation, a pair of delay (D) type flip-flop circuits FF-1 and FF-2 are coupled together such that their clock C inputs are commonly connected to an input buss 12 which is adapted to receive an input square wave whose frequency is to be divided by a count of three. The reset R and data D inputs are commonly connected to a reference potential illustrated as and referred to hereinafter as ground. The Q output of flip-flop FF-1 is directly coupled to the data D input of the flip-flop FF-2 whose $\overline{Q}$ output in turn is connected back to the set S input of the flip-flop FF-1. The set S and reset R inputs of flip-flop FF-2 are grounded. With such an interconnection the Q output of flip-flop FF-2 provides an unsymmetrical ÷ 3 square wave output as shown by waveform 14 in FIG. 2 where waveform 16 denotes the square wave input or clock signal appearing on the circuit buss 12 and applied to the clock input C of the flip-flops FF-1 and FF-2. A delay or D-type flip-flop is a circuit well known to those skilled in the art and is available as an off the shelf item, particularly as a digital integrated logic circuit module. Where such devices are used for counter applications, it simply requires the connecting of the Q output of one stage to the data D input of the next stage as shown with respect to the divide by three counter 10 shown in FIG. 1. Coupled to the Q output of FF-2 is a logic inverter or NOT logic gate 18 and one input of a coincidence or AND logic gate 20 whose other input is connected to the input or clock signal buss 12.

A third D-type flip-flop FF-3 has its data D input coupled to the output of the NOT logic gate 18. The set S and reset R inputs of FF-3 are grounded while the clock C input is connected to the input or clock signal buss 12. The output of the AND gate 20 is fed to one input of a non-coincidence or OR logic gate 22 whose other input is coupled to the Q output of the flip-flop FF-3. The output waveform appears at the output of the OR gate 22 on circuit lead 24.

The key to the operation of the subject invention is the characteristic of a D-type flip-flop connected as shown with reference to the flip-flop FF-3 in that an input signal applied to the data D input will be delayed for one clock interval of the clock signal applied to its clock C input and then appear at the Q output. Thus, for example, where a logic input is applied to the D input as the C input goes high, the logic level present at the D input will appear at the Q output the next time the C input again goes high. This characteristic is shown in FIG. 2 by considering waveforms 26 and 28 in timed relationship with the input waveform 16 which is the clock signal.

Thus, in operation, the frequency of the symmetrical square wave input 16 is divided by a factor of three in the two stage binary counter 10 providing an unsymmetrical square wave output at the Q output of FF-2 as shown by waveform 14 in FIG. 2. This waveform is commonly applied to one input of the AND gate 20 and to the input of the NOT gate 18. The output of the NOT gate 18 appears as waveform 26 and comprises the data D input signal of flip-flop FF-3. As noted above, the D-type flip-flop FF-3 operates to delay waveform 26 by one count of the clock signal 16 as shown by waveform 28. Considering the time $t_1$ as denoting the time wherein waveform 28 goes high, it continues to the time $t_2$ where it again goes low. It can be seen with reference to FIG. 2 that if the waveform 28 continued to be high until the time $t_3$, a symmetrical waveform would exist between the time $t_1$ and $t_4$, which is the same as three cycles of the input signal being divided by a count of three by the counter 10.

Looking now to the AND gate 20 which receives as inputs the input or clock signal 16 and the output waveform 14 from the counter 10, i.e., the Q output from FF-2, an output waveform such as denoted by reference numeral 30 shown in FIG. 2 will be provided which constitutes one and a half cycles of the clock signal 16. It immediately becomes evident that were the second high state 32 of the waveform 30 combined with waveform 28, a symmetrical ÷ 3 waveform would be obtained. Accordingly, the Q output of flip-flop FF-3 which comprises waveform 28, and the output of the AND gate 14, which comprises the waveform 30, are fed as separate inputs to the OR gate 22 which due to the time coincidence of the trailing edge of waveform 28 and the leading edge of the second high state 32 of waveform 30 provides a composite waveform 34 at the output of the OR gate 22 on circuit lead 24.

Thus there is produced a symmetrical divide by three output from a non-symmetrical divide by three waveform by filling in a portion of the ÷ 3 waveform by properly adding a portion of the original input square wave signal. A divide by three square wave output waveform is thus derived which has the same duty cycle as the input waveform. Moreover, the output is frequency independent in that it does not rely on its operation for an external resistor-capacitor timing network for its operation, but is controlled purely by the input signal itself which acts as the clock signal.

Having thus disclosed what is at present considered to be the preferred embodiment of the subject invention, I claim:

1. A digital divide by three counter circuit providing a symmetrical output, comprising in combination:
- input means adapted to receive a binary input signal;
- a divide by three counter circuit coupled to said input means, being operable to provide a first binary divide by three output signal;
- a first logic circuit comprising a coincidence logic gate having two inputs respectively coupled to said input means and to said counter circuit and being responsive to said binary input signal and said first binary divide by three output signal to provide a first intermediate output signal comprising one and a half cycles of said input signal;
- a logic inverter circuit coupled to said counter circuit for providing a complementary first binary divide by three output signal;
- a bistable device having one input coupled to said input means and another input to the output of said logic inverter circuit, being responsive to said input signal and said complementary first divide by three output signal to provide a second intermediate output signal comprising a time delay version of said complementary first divide by three output signal; and
- a second logic circuit comprising a noncoincidence logic gate having two inputs respectively coupled to said bistable device and said first logic circuit and being responsive to said first and second intermediate output signals to provide a composite output signal which is a symmetrical divide by three output signal.

2. The counter circuit as defined by claim 1 wherein said bistable device comprises a flip-flop circuit.

3. The counter circuit as defined by claim 2 wherein said flip-flop circuit comprises a delay type flip-flop.

4. The counter circuit as defined by claim 1 wherein said coincidence logic gate comprises an AND gate, said non-coincidence logic gate comprises an OR gate and said logic inverter circuit comprises a NOT gate.

5. The counter circuit as defined by claim 1 wherein said bistable device comprises a delay type flip-flop circuit having independent data, set, reset, and clock inputs and Q and $\bar{Q}$ outputs, and additionally including circuit means connecting said set and reset inputs to a point of reference potential, said data input to said output of said logic inverter circuit, said clock input to said input means, and said Q output to one input of said second logic circuit.

6. The counter circuit as defined by claim 1 wherein said divide by three counter circuit comprises a first and second interconnected flip-flop circuit.

7. The counter circuit as defined by claim 6 wherein said first and second interconnected flip-flop circuits comprises first and second delay type flip-flop circuits.

8. The counter circuit as defined by claim 7 wherein each said first and second delay type flip-flop circuit has independent data, set, reset, and clock inputs and Q and $\bar{Q}$ outputs, and additionally including circuit means connecting the reset and data inputs of the first flip-flop and the set and reset inputs of the second flip-flop to a point of reference potential, circuit means commonly coupling said input means to the clock input of both flip-flops, circuit means respectively interconnecting the Q output of said first flip-flop to the data input of said second flip-flop and said $\bar{Q}$ output of said second flip-flop back to the set input of said first flip-flop, and circuit means commonly connecting the Q output of said second flip-flop to one input of said first logic circuit and to the input of said logic inverter.

9. The counter circuit as defined by claim 8 and wherein said bistable device comprises a delay type flip-flop circuit having independent data, set, reset, and clock inputs and Q and $\bar{Q}$ outputs, and additionally including circuit means connecting said set and reset inputs to a point of reference potential, said data input to said output of said logic inverter circuit, said clock input to said input means, and said Q output to one input of said second logic circuit.

10. The counter circuit as defined by claim 9 wherein said first logic circuit comprises an AND gate, said second logic circuit comprises an OR gate, and said logic inverter circuit comprises a NOT gate.

* * * * *